United States Patent [19]

Gerken

[11] 3,882,403

[45] May 6, 1975

[54] DIGITAL FREQUENCY SYNTHESIZER

[75] Inventor: William G. Gerken, Pittsford, N.Y.

[73] Assignee: General Dynamics, St. Louis, Mo.

[22] Filed: Mar. 14, 1974

[21] Appl. No.: 451,665

[52] U.S. Cl. .................. 328/14; 331/1 A; 307/271
[51] Int. Cl. .......................................... H03b 19/00
[58] Field of Search ........ 331/1 A; 328/14; 307/271

[56] References Cited

UNITED STATES PATENTS

| | | | |
|---|---|---|---|
| 3,651,422 | 3/1972 | Underhill | 331/1 A |
| 3,689,849 | 9/1972 | Swanson et al. | 331/1 A |

*Primary Examiner*—John Kominski
*Attorney, Agent, or Firm*—Martin Lukacher

[57] ABSTRACT

A digital frequency synthesizer is described which employs an accumulator to determine the number of cycles of a reference frequency source which is divisible into the period of the frequency to be generated and to determine a digital number which is related to the remainder or the fractional cycle of the reference frequency required to complete the period of the generated frequency. A digital/analog interpolator translates this digital number into a fractional period and combines it with the integral determined by the accumulator division and outputs a pulse train having the combined period of the frequency to be synthesized.

22 Claims, 4 Drawing Figures

DIGITAL FREQUENCY SYNTHESIZER

The present invention relates to frequency synthesizers and particularly to digital frequency synthesizers. By a frequency synthesizer is meant a signal generator which generates any frequency in a set of frequencies to the accuracy of a reference frequency source.

The invention is especially suitable for use in radio communications equipment for generating frequencies to be injected into the local oscillator of a radio for tuning the radio to a desired frequency with high frequency resolution. The invention is also applicable wherever signals having a large number of different frequencies are desired to be generated, as in test instruments, radar, timing or clock generators, and the like.

It has been desired for a long time to use digital processing for frequency synthesis. The requirements for frequency synthesizers have however been incompatible with digital techniques. For example, frequencies are needed over a largeband of frequency and with high resolution; that is the frequencies which are to be generated should be separated by only small increments of frequency, such as 100 Hz, 10 Hz, or even 1 Hz. Known digital techniques can be adapted to provide high resolution over a small band, or low resolution over a wide band of frequencies. Attempts to resolve these conflicting requirements have necessitated such a high degree of hardware complexity, even in some cases requiring the capacity of a digital computer, as to be impractical. Such frequency synthesizers as have embodied some digital processing have been limited to frequency division and pulse combining through the use of counters and gating circuits (see U.S. Pat. Nos. 3,283,254; 3,353,104; 3,464,018; 3,217,267, 3,293,561; 3,096,483; 3,431,499; 3,375,488; and 3,538,442). Analog techniques have generally been used to obtain the output frequencies in frequency synthesizers (see U.S. Pat. No. 3,568,069). The digital techniques required to generate frequencies over a broad band with high resolution have included parallel processing and table look-up techniques. These techniques suffer from hardware complexity since they require considerable memory and arithmetic processing to effect the necessary computations, (see an article appearing in IEEE Transactions on Audio and Electroacoustics, VOL. AU-19, No. 1, Mar. 1971 by Tierney, Rader, and Gold).

It is therefore an object of the present invention to provide an improved frequency synthesizer which is operative to selectively generate any of a large number, say 100,000 or more frequencies, separated by small frequency increments which are accurate and stable in spite of the use of digital circuit components.

It is a further object of the present invention to provide an improved digital frequency synthesizer capable of generation of frequencies of a frequency set having a large number of members but with relatively few hardware components.

It is a still further object of the present invention to provide an improved digital frequency synthesizer which can readily be implemented with available digital hardware such as integrated circuits which are within the state of the art.

It is a still further object of the present invention to provide an improved digital frequency synthesizer which is capable of generating signals having different frequencies over a wide band of frequencies which signals have long term stability and contain very low noise.

It is still further object of the present invention to provide an improved digital frequency synthesizer adaptable to use microcircuits having low power consumption.

Briefly described, a digital frequency synthesizer embodying the invention uses clock signals from a reference frequency source. The number of periods of the reference frequency which are equal to the lowest integral multiple of a number which is a factor of the frequency to be synthesized which exceeds that number, are first detected. Then and upon each detection there is generated a signal which changes in amplitude. Also upon detection of the aforementioned number of periods, a signal level is provided which is proportional to the difference between the lowest integral multiple of a certain number divided by a number which is a factor of the frequency to be synthesized. When the signal which changes in amplitude equals the level, an output is provided which has a frequency equal to the frequency to be synthesized when multiplied by the factor. By virtue of the division, an interpolation of variations in the period of the output signal from the period of the reference frequency signal can be obtained and a large set of frequencies can be synthesized with a minimum of hardware.

More specifically, the invention can be embodied in a system which uses an accumulator to successively divide the certain number which is the maximum number stored therein ($2^N$) by a programmable divisor (K) during a series of timed additions, the timing being provided by the reference frequency and occurring during each period of the reference frequency. Such division in the accumulator establishes a coarse phase displacement of the frequencies to be synthesized. An interpolator circuit with an overflow detector determines when a quotient, which when multiplied by K, causes an overflow quantity of less than K. Upon detection of the overflow, a number equal to the overflow is placed in a multiplicand register, multiplied by the reciprocal of K (viz., divided by K) to normalize the overflow, and then scaled to the range of a D/A converter. The quotient is applied to the digital to analog converter to produce a voltage level proportional to the quotient. After a delay to permit the division operation and the digital to analog conversion, a negative ramp voltage is initiated. When the amplitude of the negative ramp equals the voltage level produced by the digital to analog converter an output is obtained. This output is equivalent to the residue in the accumulator and when added to that residue which occurs when the converter and ramp voltages are equal, as may be determined by a comparator circuit, an output is provided having the periodicity of the frequency to be synthesized.

The overflow is equal to $1-R$, where R is the residue in the accumulator. The negative ramp provides a function of the same form, i.e., $1 - X$. By substituting for X, $1-R$ the function reduces to $Y=R$. Thus, the output of the comparator provides a time delay corresponding to the residue rather than the overflow. The comparator thus generates a series of pulses which have a repetition period equal to the sum of the coarse and fine phase displacements which are generated during each overflow cycle. The pulses have a repetition period equal to the period of the desired frequency, or a submultiple thereof. The pulses have long-term frequency stability since they are related to the occurrence of the reference frequency. Noise is reduced to the extent of the resolution of the interpolator. The output pulses can be used to generate various waveforms, for example a sine wave by using the pulses to lock a phase lock loop, a saw-tooth wave by applying the pulses to an integrator circuit, or a square wave by applying the pulses to a flip-flop circuit.

The foregoing and other objects and advantages of the present invention, as well as additional objects, advantages and features thereof will become more readily apparent from a reading of the following description when taken in connection with the accompanying drawings in which.

Figure 1:
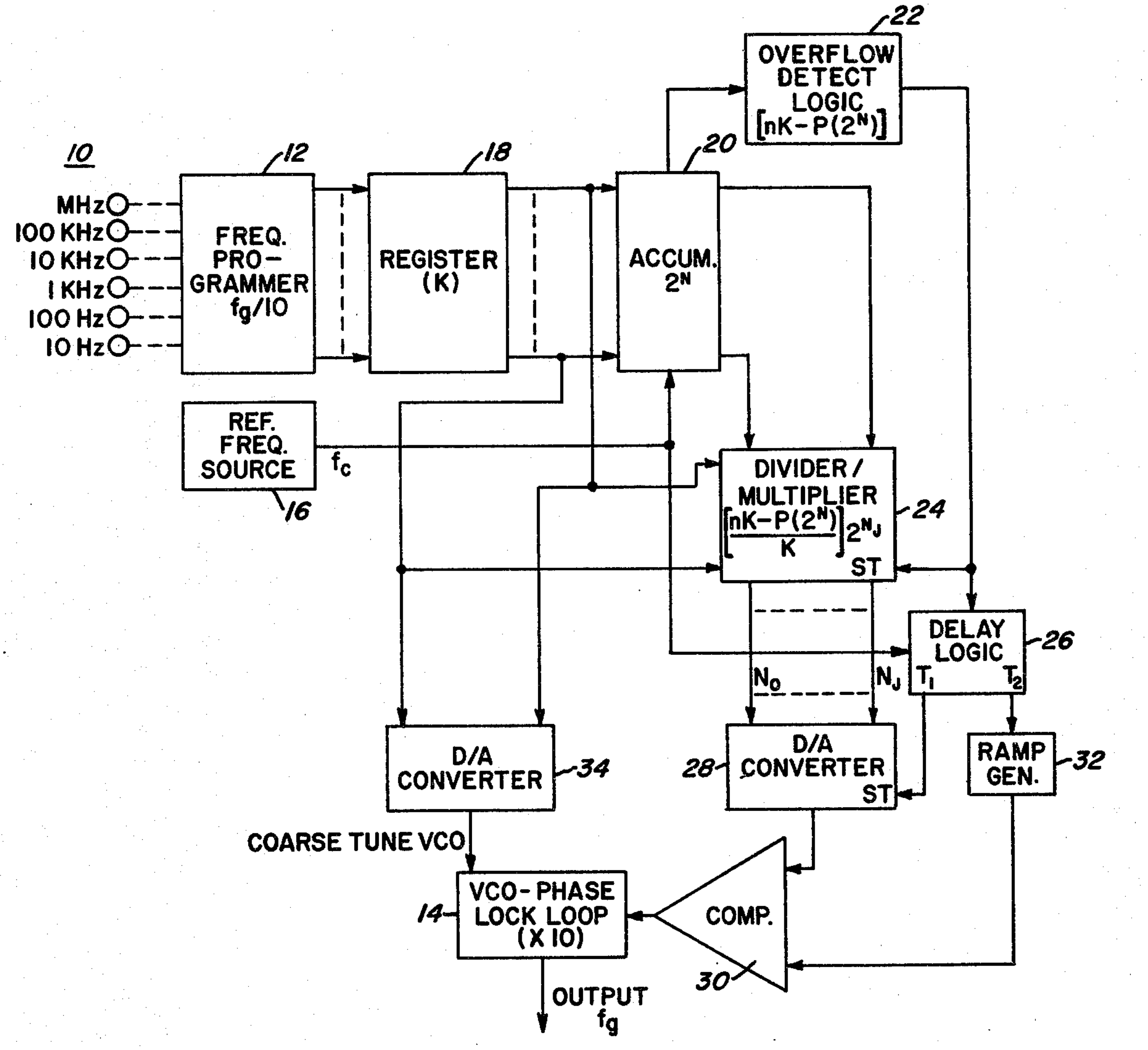
FIG. 1 is a block diagram of a digital frequency synthesizer embodying the invention.

Referring more particularly to FIG. 1, there is shown a frequency synthesizer which is capable of generating a set of frequencies suitable for injection into the mixer of a radio such as a receiver or a transmitter. The radio may be equipped with tuning knobs 10 for tuning the radio in decimally related steps; i.e., MHz, 100 KHz, 10 KHz, 1 KHz, 100 Hz, and 10 Hz steps. Accordingly, if the radio was tunable over the range from 1.5 KHz to 30 MHz, any frequency in that range which is 10 Hz apart from any other frequency, may be selected by means of the knobs 10. Then the system will produce an output frequency indicated as $f_g$ which, when applied to the mixer of the radio, will tune the radio to receive or transmit signals at the frequency selected by the knobs.

It will be appreciated of course that there will be an offset frequency between the frequency selected by the knobs 10 and the output frequency $f_g$ which is equal to the intermediate frequency of the radio system. The frequency synthesizer provided by the invention and as shown in FIG. 1 may also be programmed to provide an output signal $f_g$ which is identical in frequency to the frequency selected by the knobs. Thus, in a typical HF (High Frequency band) radio communication system the output frequency may be from 76.5 to 105 MHz. Whereas, when synthesizer output frequencies from 1.5 MHz to 30 MHz are desired, the system may be programmed such that the settings on the knobs correspond directly to the output frequency. To this end a frequency programmer 12 is provided.

The frequency programmer may be six separate rotary switches having binary coded outputs for decimal settings on the switch input shaft. Said switches are known as BCD switches. In the event that a direct output from 1.5 MHz to 30 MHz is desired, it is preferred for the practical consideration of permitting the use of digital components which are available at reasonable cost to divide the selected frequency by 10 (viz., $f_g/10$). Accordingly, the lowest frequency provided (i.e., when all of the knobs are set at minimum setting) will be 150 KHz and the highest 3 MHz. As the description proceeds it will be apparent that the system as illustrated is capable of synthesizing 2,850,000 frequencies with a spacing of 1 Hz between 150 KHz and 3 MHz. By multiplying the output frequencies by 10, as is accomplished in a voltage controlled oscillator-phase lock loop 14, the output frequencies may be provided at 10 Hz spacing from 1.5 MHz to 30 MHz. It will be noted that the frequency range for the radio system mentioned above (76.5 to 105 MHz) will also include the same 2,850,000 separate frequencies. The translation of these frequencies through the band from 76.5 to 105 MHz may also be provided by means of the voltage controlled oscillator phase lock loop 14.

The frequency stability of the output signal $f_g$ is obtained as a function of a reference frequency signal from a reference frequency source 16. This reference frequency source may be a frequency stable, say crystal controlled, oscillator, the output of which is shaped in suitable shaping circuits to produce clock pulses at the reference frequency indicated as $f_c$. The frequency of the clock pulses $f_c$ should be higher than the highest output frequency $f_g$. Preferably $f_c$ should be greater than 10 times $f_g$.

The synthesizer system provided by the invention operates by means of phase determination, the basis of which is the period of the reference frequency $f_c$. Accordingly, the accuracy of the output frequency is a function of $f_c$. Moreover, there need to be only one synthesization determinative of the output frequency per cycle of the output frequency. In other words, the sampling rate of the system is 10, effecting an increase in band width and a decrease in noise. In addition, the need for only one synthesization per cycle of the output frequency makes it possible to implement the system with a minimum of hardware, thus lowering system complexity and cost.

The frequency programmer 12 provides a multibit word at the output thereof which is stored in a register 18. This register is indicated as being the K register. The K register 18 thus has sufficient stages to store a digital number in binary form equal or greater than the highest frequency which may be programmed by the frequency programmer 12. In this illustrative example this highest frequency is 3 MHz so that the K register 18 will have 22 stages and the number stored in the K register 18 provides an index number which is successively added in an accumulator 20, each addition being made upon occurrence of a clock pulse $f_c$ from the reference frequency source 16. The clock pulses are applied to the strobe (ST) input of the accumulator. The accumulator itself has a sufficient number of stages to store or accumulate the number of different frequencies to be generated. The accumulator thus has storage for a N bit binary number which is equal or greater than the highest frequency to be generated. In the event that the synthesizer system is thought of as generating a certain number of frequencies, then the K register 18 will be programmed to store numbers corresponding to the frequencies to be generated, while the accumulator will have a capacity to accumulate in its N stages, a certain number $2^N$, where $2^N$ is equal or greater than the number of frequencies to be generated by the synthesizer.

In this illustrative example where the highest frequency to be generated is 3 MHz with frequency spacings of 1 Hz, $2^N$ is equal or greater than the difference between 15 times $10^4$ and 3 times $10^6$, or 2,850,000. Since the accumulator operates in binary code, N must be at least 22 which is also larger than 3 times $10^6$ which is higher than the highest frequency to be generated. In order to increase system accuracy it is preferable that the clock frequency $f_c$ be ten times the highest generated frequency, or 30 MHz. It is then preferred that the accumulator capacity be increased correspondingly or to 10 times 2,850,000, which equals 28,500,000. Since N is an order of 2, 25 stages should be used in the accumulator, thus providing a storage capacity in the accumulator of $2^{25}$ or 33,554,432.

At the outset, i.e., when any of the frequency control knobs 10 is adjusted to change the frequency to be generated, or when the synthesizer is initially put into operation after being idle, a reset pulse is applied to the accumulator 20 as well as to the other components in the system. The reset logic for providing the pulse is not shown to simplify the illustration. For each clock pulse the accumulator is indexed by the number K which is stored in the register 18. After n such clock pulses a quantity nK will be in the accumulator 20 which will be greater than the capacity $2^N$ of the accumulator. When this occurs, the highest order stage of the accumulator will cycle from "0" to "1" and back to 0; thus designating that the accumulator has overflowed. Overflow detector logic 22 detects this overflow condition upon occurrence thereof. In other words the overflow detector logic 22 detects the occurrence of the clock pulse which makes nK greater than $2^N$. This overflow occurs once each cycle of the generated frequency and therefore each time when nK is greater than P $(2^N)$ where P equals the number of cycles of the generated frequency.

It will become more apparent as the description proceeds that the rate at which overflows are detected is the sampling rate of the system and that the phase of the generated frequency is determined at this sampling rate. The sampling rate is equal to the frequency of the generated signal. Since the phase is determined or calculated once each cycle of the generated frequency, rather than a plurality of times, the bandwidth of the system is increased, the phase noise is reduced and the frequencies are generated with greater accuracy.

When an overflow is detected the number representing the amount of this overflow will remain in the accumulator 20. This overflow number is equal to $n\mathrm{K}-\mathrm{P}(2^N)$. This overflow number, which is a binary integer is also carried over into the next determination of the overflow of the accumulator 20. Since the overflow quantity is a function of the period of the reference frequency $f_c$, by carrying over the overflow in successive determinations of the phase of the generated frequency, the generated frequency will have the long-term frequency stability of the reference frequency source. However, the detection of the overflow is the result of a division process (i.e., how many periods of reference frequency $f_c$ will divide into a period of the generated frequency). In other words, the accumulator 20 performs a coarse division dividing $2^N$ by K and solving only for integers.

The overflow in the accumulator 20 is a number which represents the difference in phase between the generated frequency and an integral number of cycles of the reference frequency. The determination of the phase difference represented by this overflow will uniquely define the phase of the generated frequency with the stability of the reference frequency.

This phase determination is accomplished once each cycle through the use of a divider/multiplier 24 which divides the overflow quantity $n\mathrm{K}-\mathrm{P}(2^N)$ by K and multiplies it by the full scale range of the D/A converter $(2^N)$. The divider/multiplier 24 has a binary divider having a dividend input from the output of the accumulator 20 and a divisor input from the K register 18. Both inputs are strobed into the divider upon occurrence of an overflow by means of a strobe signal to the strobe input of the divider from the overflow detector logic 22. The multiplication is effected by placing the accumulator 20 output into the higher order stages of the dividend register. The quotient output of the divider/-multiplier 24 is a binary number representing what fraction the overflow number is to the divisor K. The divider normalizes the overflow to the scale of the D/A converter. The K register can be programmed to store numbers corresponding to the frequency to be generated or any integral multiple (or submultiple) thereof. In the illustrated case the submultiple 1/10 is used.

The strobe signal from the overflow detector, which occurs upon detection of an overflow in the accumulator, is also applied to delay logic 26. The delay logic may be a counter which counts a fixed number of clock pulses to provide a delay not dependent upon circuit settling time and yet allowing time for transients and operation of the digital components of the system. At a first time $T_1$, say after the occurrence of one or two $f_c$ clock pulses, a digital to analog converter 28 is strobed to apply its output to a comparator 30. After the expiration of another clock pulse time, a pulse $T_2$ enables a ramp generator 32 to generate a negative ramp which is a linearly decreasing voltage, which as a function of time is of the form 1—R. The digital to analog converter converts the number at the quotient output of the divider/multiplier 24 into a voltage level which together with the ramp is applied to the comparator 30. Since the quotient in the divider is related to the overflow number, which in turn is related to the remainder (how much K would have had to be at the time an overflow occurred for the overflow number to be reduced to zero), the level at the output of the digital to analog converter is also of the form 1—R where R is the remainder or residue; the residue being the difference between an entire period (K) and the overflow, rather than the overflow itself.

The negative ramp generator 32 provides a function which is of the form 1—R. Accordingly, the time required for the negative ramp to reach an amplitude equal to the level at the output of the digital to analog converter corresponds to the remainder and of course to the difference in the phase of the generated frequency and integral number of cycles of the reference frequency.

The output of the comparator 30 is used to lock the VCO phase lock loop 14 as by being an input to the phase detector thereof. The other input to the phase detector is supplied by the voltage controlled oscillator. The voltage controlled oscillator of the phase lock loop 14 may be coarse tuned by a digital to analog converter 34 which provides a level corresponding to the digital number in the K register 18. In the event that the range over which the voltage controlled oscillator is to operate is relatively small, say from 76.5 to 105 MHz, as where the synthesizer is used in a radio, coarse tuning of the voltage controlled oscillator with a digital to analog converter 34 may 34 omitted.

Figure 2:
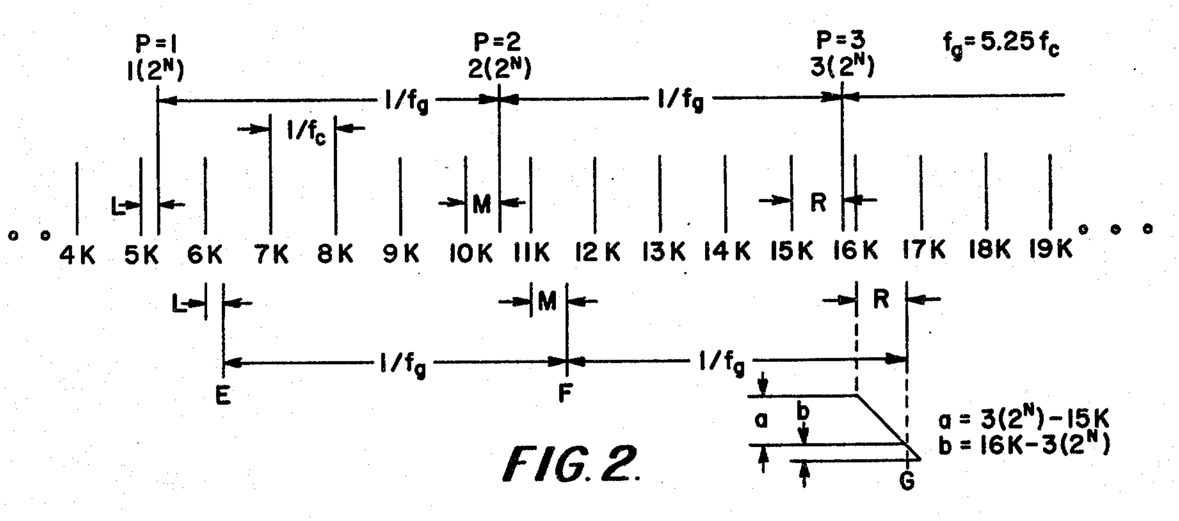
FIG. 2 is a timing chart which is explanatory of the operation of the synthesizer shown in FIG. 1.

The operation of the digital synthesizer system may be more apparent from FIG. 2 which depicts an exemplary case where the clock frequency $f_c$ is 5.25 times greater than the generated frequency $f_o$. At the time of the 6th clock pulse 6K, the 11th clock pulse 11K, and the 16th clock pulse 16K, the accumulator 24 will overflow and the overflow detector logic 22 will provide an output. These points in time correspond to when $P(2^N)$ — the number stored in the accumulator — exceeds $2^N$, $2(2^N)$, and $3(2^N)$. Since the system operates similarly upon each overflow detection consider by way of example, the overflow which occurs when P=16, with the overflow remaining in the accumulator 20, is equal to $16K-3(2^N)$. The overflow is entered into the divider/multiplier 24 wherein it is divided by K so as to determine what fraction the inverval between $3(2^N)$ and 16K is of the interval between 15K and 16K. This fraction is of the form 1—R where R is the remainder or corresponds to the difference in phase between the second cycle of the generated frequency (the cycle between F and G) and an integral number of cycles of the clock frequency (the cycles occurring between 11 K and 16K). The quotient from the divider/multiplier 24 is therefore in the form 1—R. The negative ramp from the generator 32 starts at approximately 16K (it will be recalled that the delay logic 26 counts a few clock pulse cycles). The ramp goes negative until a level corresponding to the value $16K-3(2^N)$ at the output of the digital to analog converter 28 is reached. At that time the comparator 30 delivers an output pulse. In effect therefore, the period R is added to an integral number of clock pulse cycles for periods. As shown in FIG. 2, the period R corresponds to the remainder, $a=3(2^N)-15K$, rather than the overflow, $b=16K-3(2^N)$. Since the previous output occurred after the interval M was added after the occurrence of the 11K clock pulse, the interval between F and G is equal to the interval corresponding to $2^N$ divided by K. The divider/multiplier 24, the digital to analog converter 28, and the ramp generator 32, together with the comparator 30 provide a simplified means for determining the remainder without complex arithmetic processing, thus simplifying the hardware.

The operation of the system may be further apparent from the following numerical examples. Consider that the frequency to be generated is 16 MHz. K is then a binary number equal to 16 MHz ÷ 10 or 1,600,000. Since the highest generated frequency is 30 MHz the capacity of the accumulator will be for the purpose of this example considered equal to $30 \times 10^6$. Since the output frequency will be multiplied by 10 in the VCO phase lock loop 14, K is a submultiple (one 10th) of the generator frequency $f_g$. Since 1,600,000 divides into 30,000,000 18.75 times, the overflow detector logic 22 will provide an output on the 19th clock pulse. The resulting overflow $nK-P(2^N)$ is equal to 19 $(1.6 \times 10^6)$ or $30.4 \times 10^6 - 30 \times 10^6$, or $0.4 \times 10^6$. When this overflow is divided by K in the divider/multiplier, the output of the divider is $0.4 \times 10^6 \div 1.6 \times 10^6$, or 0.25. Assuming that the full scale output of the digital to analog converter occurs with an input of 1,000 it is desirable to scale up or multiply the input from the divider by 1,000. In any event the digital to analog converter output will be 0.25 its maximum voltage.

Assuming that the ramp generator 32 starts at a voltage equal to the maximum voltage from the digital to analog converter, it reaches 0.25 the maximum after 0.75 of a clock period, at which time the comparator 30 produces an output pulse. On the second cycle of the generated frequency (P 2) the accumulator 20 starts with the first cycle overflow or a count of 400,000. On the second cycle, i.e., when P=2, an overflow occurs on the 38th clock pulse cycle and the overflow is equal to $60.8 \times 10^6 - 60 \times 10^6$, or $0.8 \times 10^6$. In the divider/multiplier 24, the quotient which results is equal to 0.5. Assuming a scaling or multiplying factor of 1,000, a binary quantity equal to 500 is inputted to the digital to analog converter 28. This produces an output pulse from the comparator 30 after 0.5 of a clock period. It will be seen therefore, that the first output from the comparator 30 occurred at 19.75 clock pulse cycles, and the second at 38.5 clock pulse cycles. The period of the generated frequency is then 18.75 clock periods. This period is equal to $18.75 \times 1/(30 \times 10^6,)$ where $f_c$ is equal to $30 \times 10^6$, or 0.625 microseconds. A period of 0.625 microseconds corresponds to a frequency of 1.6 MHz. When this frequency is effectively multiplied by 10 in the VCO phase lock loop 14 the generated frequency $f_g$ of 16 MHz is produced.

Figures 3, 4:
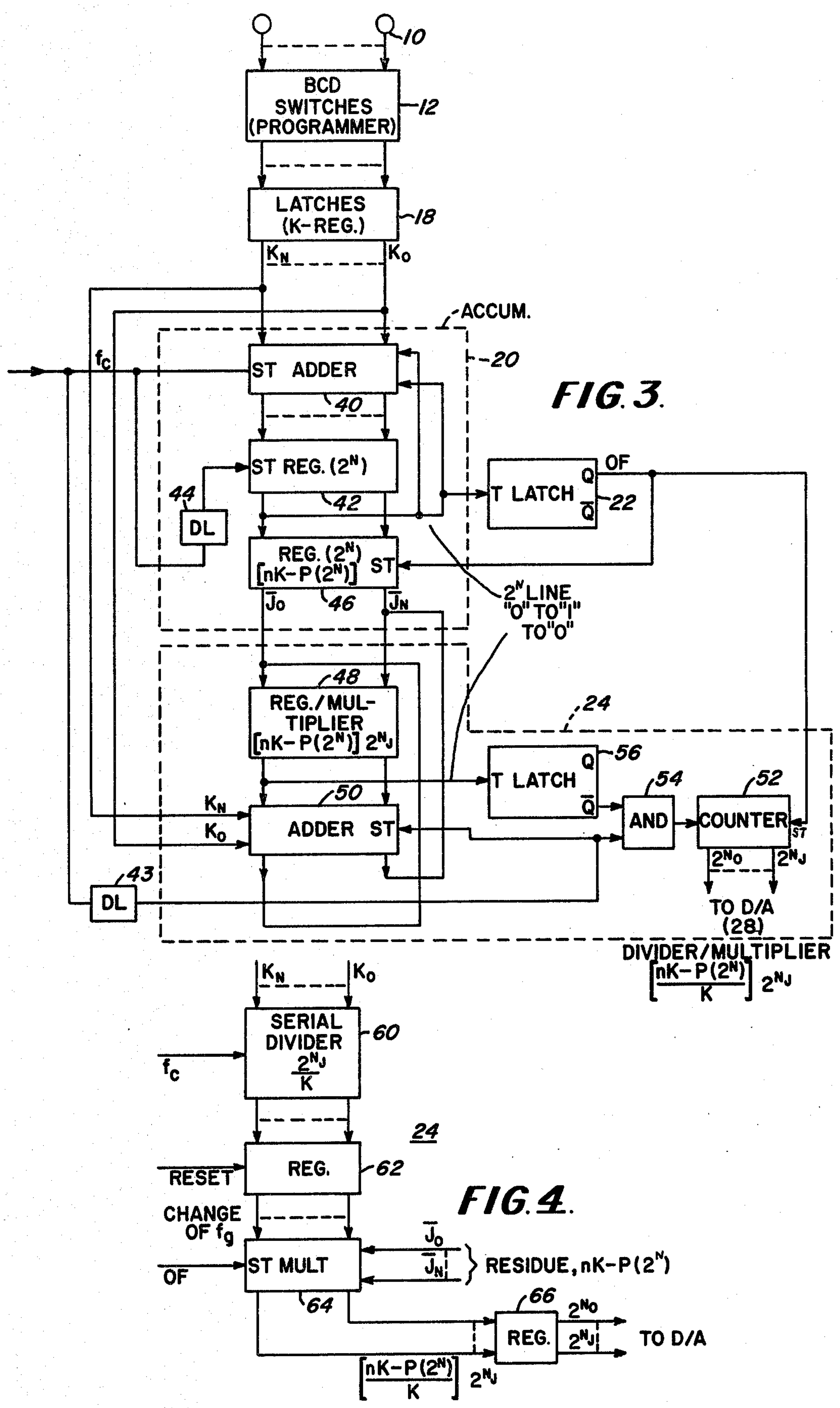
FIG. 3 is a more detailed block diagram showing the program or register accumulator overflow detector and divider of the system shown in FIG. 1.
FIG. 4 is a block diagram illustrating another divider which may be used in the system shown in FIG. 1.

Referring to FIG. 3 there is shown in greater detail exemplary components which may be used to provide the digital synthesizer system. The frequency selection knobs 10 operate the BCD switches of the programmer 12 which set, in parallel, latches which make up the K register 18. The K register 18 has a latch for each of the bits $K_O$ to $K_N$ which make up a program word. The accumulator 20 includes an adder 40 which consists of N full adder stages connected in series (i.e., with the carry output of the lower order stage applied as an input, together with one of the $K_O$ to $K_N$ bits from the K register latches 18. The sum outputs of the adder are applied in parallel to another register 42 which has storage for the N bits. The output of the register 42 is also applied in parallel each to a successively higher order stage of the adder 40. Thus, upon application of each clock pulse to the strobe (ST) input of the adder 40, a sum is formed of the number in the K register and the number in the output register 42.

When the frequency select knobs 10 are adjusted to select a new frequency or the system is initially turned on, the registers are reset. The K register 18 is enabled to store the number presented by the programmer swithces 12. The next clock pulse $f_c$ inserts the number from the K register 18 into the adder 40. After a delay (less than a clock pulse period) which is provided by a delay circuit 44, the output register 42 is strobed so as to store the number from the first addition. Since the output register 42 is empty upon occurrence of the first clock pulse, the results of the first addition will be the number K which is then inputted by the delay clock pulse into the output register 42.

Upon the occurrence of the second clock pulse, the number K which is already in the output register, will be added to itself in the adder 40. The delayed clock pulse will cause the number equal to 2 × K to be inputted into the output register 42. In this manner successive additions of K are made until an overflow is detected which occurs when the highest order stage in the output register 42 switches from 0 to 1 and then back to 0 again.

The highest order stage is connected to the trigger input of a latch which serves as the overflow detect logic 22. Each time an overflow was detected the Q output of the latch will assume a logic level representing a 1. Thus, the transition of the Q output of the latch from 0 to 1 represents the detection of an overflow in the register 42. The accumulator also contains an overflow register 46 which is strobed by the overflow detector to store the overflow contained in register 42. Upon detection of an overflow therefore, the overflow number will be stored both in the overflow register 46 and in the output register 42. Since the overflow remains as a residue in the output register 42, it will be carried over into the next cycle for the purposes of maintaining the generated frequency with the long term stability and accuracy of the reference frequency source 16 (FIG. 1).

The overflow register 46 retains the residue or overflow number for operation in divider/multiplier 24. Divider/multiplier 24 performs the function of normalizing the overflow to the range of the D/A converter. It solves the mathematical equation $$x = \frac{nK - P(2^N)}{K} [2^{No}]$$

where $nK - P(2^N)$, the overflow is divided by K, the coarse division divisor to obtain a fractional value which is multiplied by $2^{No}$, the full scale range of the D/A converter. The hardware to perform this function can be done serially when generating a small number of frequencies. The multiplication function is performed by addressing bits $\bar{J}_o$ to $\bar{J}_n$ which is the "1's" complement of the number stored in the overflow registered to the higher order stages of the divider register 48. The lower order stages are also 1's complemented. The order to which these bits ($\bar{J}_o$ to $\bar{J}_n$) are addressed is dependent upon the accuracy of the D/A converter. For example, if the D/A converter had eight bit accuracy (full scale range equal to the binary equivalent of 256), bits $\bar{J}_o$ to $\bar{J}_n$ would be addressed to the orders immediately above the eighth order. This has the effect of multiplying the 1's complement of the overflow by the 1's complement of the full scale range of the D/A converter. Division in this example is accomplished by successive subtractions. Subtraction is performed by adding the denominator K to the 1's complement of the numerator contained in register 48 using adder 50. The sum is held in register 48. Successive additions of K occur each clock pulse until register 48 becomes full as determined by the highest order or $2^N$ bit thereof changing state from a 0 to 1. The number of clock pulses that have occurred are equal to the number of times that K is divisible into the numerator (i.e., the number that fills register 48). A counter (52) is reset prior to this division by latch 22 and then counts clock pulses which are applied thereto via a delay circuit 53 and AND gate 54. The AND gate 54 is enabled until latch 56 is set when the highest order ($2^N$) stage of register 46 cycles from a 1 to an 0. Since this condition occurs when register 46 overflows or, since it is effectively performing subtraction and therefore occurs when register 46 goes to a negative value, the count contained in counter 52 is one greater than the number of times K is divisible into the numerator and accordingly must be compensated. The compensation is effected when resetting the counter between generated frequency cycles to a minus one. The quotient resulting from the division and contained in counter 52 is applied to the digital to analog converter (28). The counter 52 is connected directly to D/A converter 28 permitting the converter to track the counter reducing the final settling time. It should be noted that the overflow $[nK - P(2^N)]$ and the K factor may be rounded off to further reduce the hardware and the division time. No improvement is realized if the K factor has a higher order than D/A converter 28. A corresponding rounding off of the overflow must accompany the rounding off of the K factor. The rounding off is accomplished by simply not transferring the lower order bits to the multiplier/divider 24.

It must be recognized that other divider schemes may be implemented which can offer greater speed but with a greater complexity of hardware. The requirements of the applications will determine the scheme to use. Basic divider schemes are discussed in the text by R. K. Richards, entitled "Arithematic Operations in Digital Computers," published by D. Van Nostrand Company. Inc., 120 Alexander Street, Princeton, N.J., in the Tenth Printing Sept. 1965.

FIG. 4 illustrates a divider multiplier which may be used when higher speeds of system operation are required. The division is performed out-of-loop or off-line eliminating a major time consuming operation from the loop. This may be permitted since two quantities of the equation $$x = \frac{nK - P(2^N)}{K} [2^{No}]$$

are constants for a given frequency. The divider performs the division $$\frac{2^{No}}{K}$$

only once each time the frequency to be generated is changed.

The divider may be one of the dividers described in the above referenced text.

The K register (18) outputs $K_o$ through $K_n$ are applied to the divisor input of serial divider 60. The dividend register is set to the full scale range ($2^{No}$) or D/A converter 28. The division occurs each time the K register (18) is re-programmed. The quotient is transferred to multiplicand register 62 when the division operation is completed. The next multiplication will use the new multiplicand. The overflow $[nK - P(2^N)]$ from overflow register 46 is applied in parallel to the other input of multiplier 64. The product is the overflow normalized to the range of D/A converter 28. The product is applied in parallel to the D/A converter via the output register 66. The product is converted into a voltage level which is proportional in amplitude to the overflow (FIG. 1). To maximize the speed, parallel multipliers can be used that are capable of performing the multiplications required for the previous example cited. Parallel multipliers are described in the referenced text. The multiplication, of course, occurs once for each cycle of generated frequency and begins when register 42 overflows and is detected by the overflow detection logic 22.

From the foregoing description it will be apparent that there has been provided an improved frequency synthesizer which is operative in accordance with digital techniques to synthesize frequencies over a wide band of frequencies. While a synthesizer has been described which is capable of synthesizing frequencies over a 28.5 MHz wide band, it will be appreciated that the system is applicable to the generation of frequencies in other bands and for various purposes in addition to radio frequency communication.

What is claimed is:

1. A frequency synthesizer which comprises a. means for providing a reference frequency signal;
b. means for detecting the number of periods of said reference frequency signal equal to the lowest integral multiple of a number which is a factor of the frequency to be synthesized, which exceeds a certain number;
c. means operated by said detecting means for providing upon detection of said number of periods, a signal which changes in amplitude;
d. means also operated by said detecting means upon the detection of said number of periods for providing a signal level proportional to the difference between said lowest integral multiple and said certain number divided by said number which is a factor of the frequency to be synthesized;
e. means for generating an output when said signal which changes in amplitude and said level are equal to each other; and
f. said output providing the signal having the frequency to be synthesized.

2. The invention as set forth in claim 1, further comprising means controlled by said output for providing the frequency synthesized signal.

3. The invention as set forth in claim 2 wherein said output controlled means is a phase locked loop which is locked to said output.

4. The invention as set forth in claim 1 wherein said certain number of $2^N$, said number which is a factor of the frequency to be synthesized is K, and said number of periods is P, said detecting means being operative to detect said lowest integral multiple $n$, when $nK > P(2^N)$.

5. The invention as set forth in claim 4 wherein said means for providing said signal level includes means operative to provide a number equal to $$\left[\frac{nK-P(2^N)}{K}\right]2^N.$$

6. The invention as set forth in claim 5 wherein said means which provides said signal which changes in amplitude is operative to provide said signal which, as a function of time, has a form similar to the number provided by said signal level providing means.

7. The invention as set forth in claim 6 wherein the form of said signal which changes in amplitude is $(1 - R)$ where R has a value proportional to $nK - P(2^N)$.

8. The invention as set forth in claim 1 wherein said detecting means comprises an accumulator having storage for said certain number, means for successively incrementing said accumulator during each period of said reference frequency signal by said number which is said factor of said frequency to be synthesized, and means for detecting an overflow from said accumulator.

9. The invention as set forth in claim 8 wherein said incrementing means comprises a register, and means for programming said register to store said number which is said factor of said frequency to be synthesized.

10. The invention as set forth in claim 9 wherein said programming means comprises a plurality of switches each for a different decimal digit of the frequency to be synthesized, each of said switches having BCD outputs connected to said register for setting said register to store a binary number corresponding to said frequency.

11. The invention as set forth in claim 8 wherein said accumulator has N stages, $2^N$ being said certain number.

12. The invention as set forth in claim 11 wherein $2^N$ is equal or greater than the highest frequency to be synthesized.

13. The invention as set forth in claim 12 wherein said reference frequency is greater than said highest frequency.

14. The invention as set forth in claim 13 wherein said reference frequency is at least ten times greater than said highest frequency.

15. The invention as set forth in claim 8 wherein said signal level providing means comprises a divider, means operative by said overflow detecting means for transferring the number stored in said accumulator to the dividend input of said divider, means for transferring the number stored in said register to the divisor input of said divider, and means for converting the number provided at the quotient output of said divider into said level.

16. The invention as set forth in claim 15 wherein said converting means is a digital to analog converter.

17. The invention as set forth in claim 16 further comprising means operated by said overflow detecting means for providing a first output a certain time after each overflow is detected, and means for enabling said digital to analog converter upon occurrence of said first output.

18. The invention as set forth in claim 17 wherein said means for providing said signal which changes in amplitude is a negative ramp generator which provides ramp voltage of linearly decreasing amplitude, and means operated by said overflow detecting means for initiating said ramp voltage a certain time after said digital to analog converter is enabled to provide said signal level.

19. The invention as set forth in claim 18 wherein said means for generating said output comprises a comparator.

20. The invention as set forth in claim 19 further comprising a phase locked loop including a voltage controlled oscillator, which provides said synthesized signal and means for applying said output to said loop for locking said oscillator thereto.

21. The invention as set forth in claim 20 further comprising a digital to analog converter having its digital inputs connected to said register and its analog output connected to said oscillator for coarse tuning said oscillation to the frequency of the signal to be synthesized.

22. The invention as set forth in claim 20 wherein said factor is an integral submultiple of said frequency to be synthesized and said oscillator is tuned to a frequency which is multiplied by the reciprocal of said integral submultiple.

* * * * *